US012628655B2

(12) United States Patent
Park et al.

(10) Patent No.: US 12,628,655 B2
(45) Date of Patent: May 12, 2026

(54) METHOD FOR SELECTIVELY FORMING A SHIELDING LAYER ON A SEMICONDUCTOR DEVICE

(71) Applicant: STATS ChipPAC Pte. Ltd., Singapore (SG)

(72) Inventors: SeongHwan Park, Incheon (KR); Bom Lee, Incheon (KR); KyoungHee Park, Seoul (KR)

(*) Notice: Subject to any disclaimer, the term of this patent is extended or adjusted under 35 U.S.C. 154(b) by 381 days.

(21) Appl. No.: 18/315,479

(22) Filed: May 10, 2023

(65) Prior Publication Data

US 2023/0411305 A1     Dec. 21, 2023

(30) Foreign Application Priority Data

May 18, 2022     (CN) .......................... 202210548058.4

(51) Int. Cl.
| | |
|---|---|
| *H10W 42/20* | (2026.01) |
| *H10W 74/01* | (2026.01) |
| *H10W 74/10* | (2026.01) |
| *H10W 90/00* | (2026.01) |

(52) U.S. Cl.
CPC ........... *H10W 42/20* (2026.01); *H10W 74/01* (2026.01); *H10W 74/114* (2026.01); *H10W 90/00* (2026.01); *H10W 42/271* (2026.01)

(58) Field of Classification Search
CPC ...................................................... H01L 23/552
See application file for complete search history.

(56) References Cited

U.S. PATENT DOCUMENTS

| | | | |
|---|---|---|---|
| 9,859,232 B1 * | 1/2018 | Chiang | .............. H01L 23/3121 |
| 10,985,109 B2 | 4/2021 | Kim et al. | |
| 2020/0176392 A1 | 6/2020 | Han et al. | |
| 2020/0315488 A1 | 10/2020 | Rogers et al. | |
| 2022/0007554 A1 * | 1/2022 | Jeon | ..................... H05K 9/0024 |
| 2022/0077074 A1 | 3/2022 | Han et al. | |
| 2024/0203897 A1 * | 6/2024 | Wu | .......................... H01L 21/50 |

* cited by examiner

*Primary Examiner* — Yu-Hsi D Sun
(74) *Attorney, Agent, or Firm* — .Junhe Law Office, P.C.; Yi Zhang

(57) ABSTRACT

A method for selectively forming a shielding layer on a semiconductor device comprises: attaching a tape stack onto a predetermined area of a substrate of the semiconductor device, wherein the tape stack comprises a lower tape layer that covers the predetermined area and an upper tape layer that extends beyond the predetermined area and overhangs above an intermediate area adjacent to the predetermined area; applying a shielding layer to the substrate of the semiconductor device; and removing the tape stack and a portion of the shielding layer formed on the tape stack from the substrate of the semiconductor device.

12 Claims, 6 Drawing Sheets

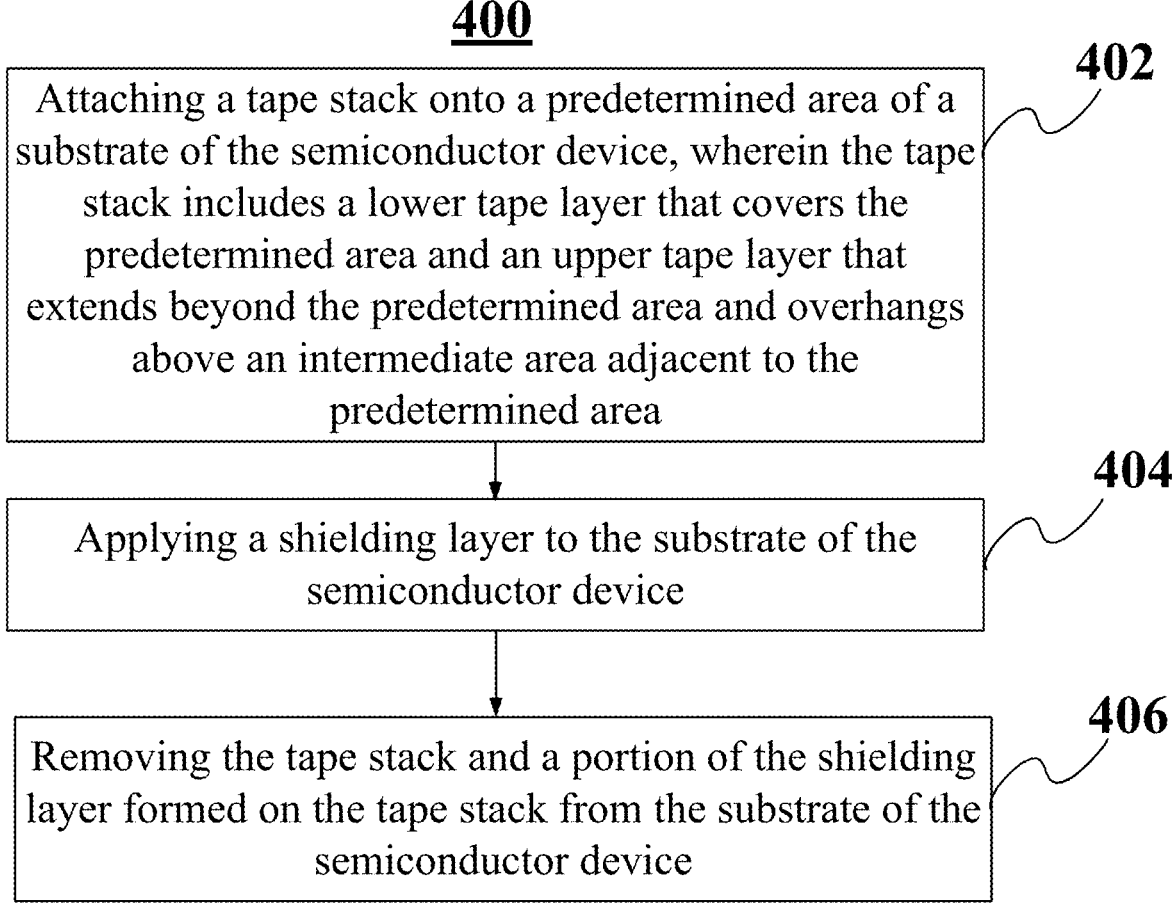

400

| 402 |

Attaching a tape stack onto a predetermined area of a substrate of the semiconductor device, wherein the tape stack includes a lower tape layer that covers the predetermined area and an upper tape layer that extends beyond the predetermined area and overhangs above an intermediate area adjacent to the predetermined area

| 404 |

Applying a shielding layer to the substrate of the semiconductor device

| 406 |

Removing the tape stack and a portion of the shielding layer formed on the tape stack from the substrate of the semiconductor device

FIG. 4

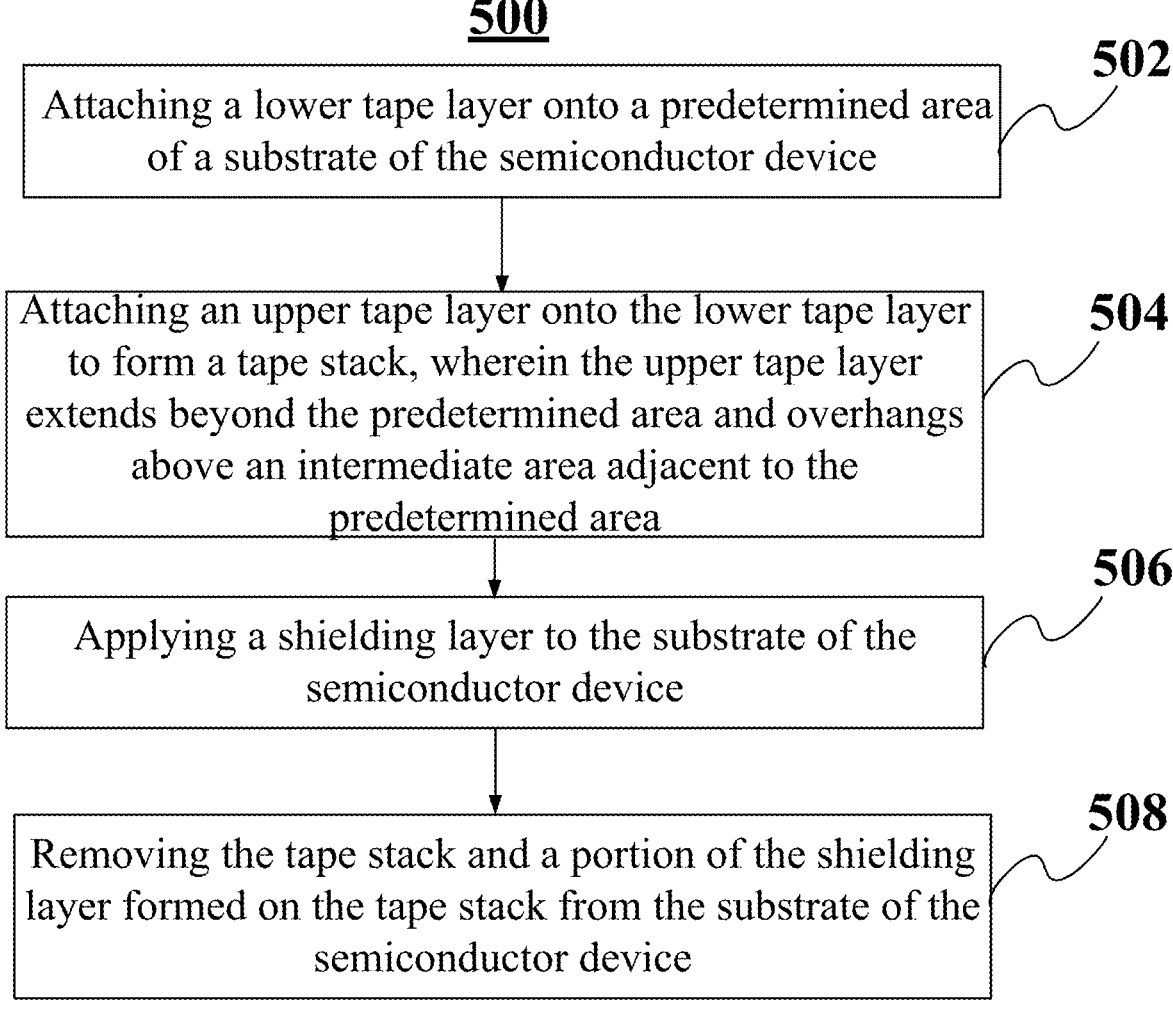

500

502

Attaching a lower tape layer onto a predetermined area of a substrate of the semiconductor device

504

Attaching an upper tape layer onto the lower tape layer to form a tape stack, wherein the upper tape layer extends beyond the predetermined area and overhangs above an intermediate area adjacent to the predetermined area

506

Applying a shielding layer to the substrate of the semiconductor device

508

Removing the tape stack and a portion of the shielding layer formed on the tape stack from the substrate of the semiconductor device

FIG. 5

METHOD FOR SELECTIVELY FORMING A SHIELDING LAYER ON A SEMICONDUCTOR DEVICE

TECHNICAL FIELD

The present application generally relates to semiconductor packaging technology, and more particularly, to a method for selectively forming a shielding layer on a semiconductor device.

BACKGROUND OF THE INVENTION

The semiconductor industry is constantly faced with complex integration challenges as consumers want their electronic products to be lighter, smaller and have higher performance with more and more functionalities. One of the solutions is System-in-Package (SiP). SiP is a functional electronic system or sub-system that includes in a single package two or more heterogeneous semiconductor die, such as a logic chip, a memory, integrated passive devices (IPD), RF filters, sensors, heat sinks, or antennas. A problem in which interference such as electromagnetic interference (EMI) between the components in one module or other modules may occur. Typically, a semiconductor device may be provided with a metal cover or a uniformly spread coating around its outer periphery as a shielding layer. However, some components (e.g., antennas) in the semiconductor device are required to be exposed without shielding layer, for example, for connection or transmission purpose.

Therefore, a need exists for selectively forming a shielding layer on a semiconductor device.

SUMMARY OF THE INVENTION

An objective of the present application is to provide a method for selectively forming a shielding layer on a semiconductor device.

In an aspect of the present application, a method for selectively forming a shielding layer on a semiconductor device is disclosed. The method comprises: attaching a tape stack onto a predetermined area of a substrate of the semiconductor device, wherein the tape stack comprises a lower tape layer that covers the predetermined area and an upper tape layer that extends beyond the predetermined area and overhangs above an intermediate area adjacent to the predetermined area; applying a shielding layer to the substrate of the semiconductor device; and removing the tape stack and a portion of the shielding layer formed on the tape stack from the substrate of the semiconductor device.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIG. 4 is a flowchart illustrating a method for selectively forming a shielding layer on a semiconductor device according to an embodiment of the present application.

FIG. 5 is a flowchart illustrating a method for selectively forming a shielding layer on a semiconductor device according to another embodiment of the present application.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
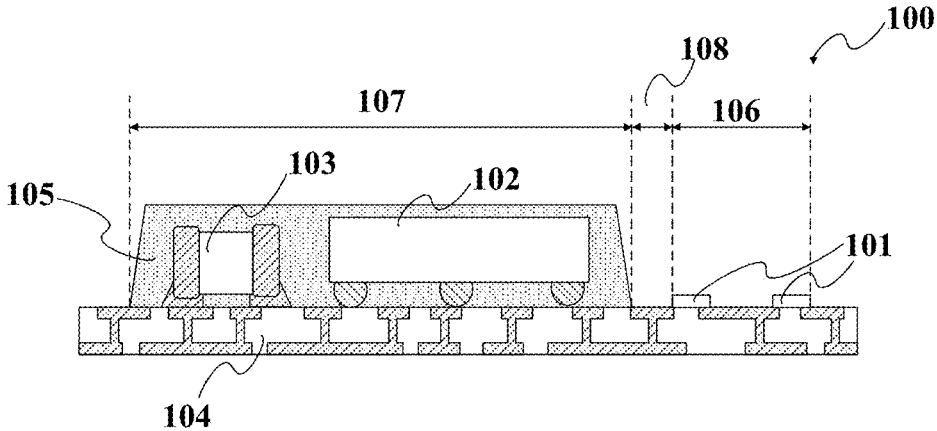
FIG. 1 is a schematic diagram showing an example of a semiconductor device according to an embodiment of the present application.

FIG. 1 is a schematic diagram showing a semiconductor device 100 according to an embodiment of the present application. As shown in FIG. 1, the semiconductor device 100 may include a conductive pattern 101, a semiconductor component 102 such as a semiconductor die or a semiconductor package, and a discrete device 103. Although the semiconductor device 100 is shown as including one semiconductor component 102 and one discrete device 103 for illustration purpose, those skilled in the art can understand that a semiconductor device may include more semiconductor components and/or discrete devices, or may not include a semiconductor component or a discrete device. For example, the electronic component 102 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc.; the discrete device 103 may include one or more passive electrical components such as resistors, capacitors, inductors, etc. Furthermore, the semiconductor device 100 may include a substrate 104 which supports the conductive pattern 101, the semiconductor device 102 and the discrete device 103. In practice, the semiconductor component 102 and the discrete device 103 can be mounted onto the substrate 105 using any suitable surface mounting techniques. As shown in FIG. 1, the semiconductor die 102 and the discrete device 103 may be encapsulated by an encapsulant 105, which may be made of a polymer composite material such as epoxy resin with filler, epoxy acrylate with filler, or polymer with proper filler, for example.

The conductive pattern 101 is arranged on a first area 106 of a surface of the substrate 104, and the semiconductor die 102 and discrete device 103 as well as the encapsulant 105 are arranged on a second area 107 of the surface of the substrate 104. The first area 106 and the second area 107 are spaced from each other by an intermediate area 108. For the semiconductor device 100, electromagnetic interference (EMI) may occur and therefore may interrupt, obstruct, or otherwise degrade or limit the effective performance of circuits of the semiconductor component 102 and the discrete device 103. Thus, it is desired to form a shielding layer for the semiconductor die 102 and the discrete device 103, i.e., formed on the encapsulant 105 which covers the semiconductor die 102 and the discrete device 103, so as to shield EMI or other interferences induced to (or generated by) the semiconductor component 102 and the discrete device 103. In some embodiments, the shielding layer may be one or more layers of Al, Cu, Sn, Ni, Au, Ag, or other suitable conductive material. Meanwhile, it is also desired to expose the conductive pattern 101 for transmission purpose, or other purposes. Therefore, the shielding layer should be selectively formed on the semiconductor device 100, i.e., formed on the second area 107 but not formed on the first area 106.

It should be noted that the conductive pattern 101 is only an exemplary component or structure that are desired to be exposed from the semiconductor device 100 without EMI shielding, for illustrating the method of selectively forming EMI shielding on the semiconductor device. This invention may also be applied to a semiconductor device that includes some other electrical components desired to be exposed without EMI shielding.

Figure 2A:
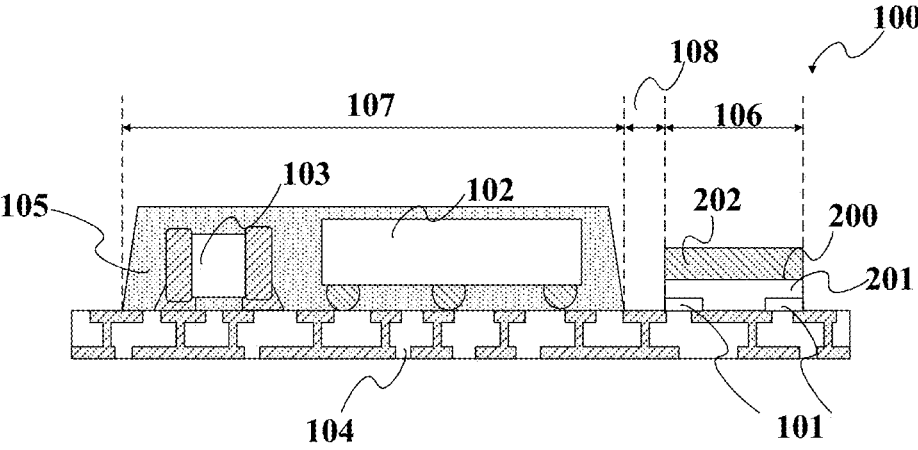
FIG. 2A-2C are schematic diagrams showing a conventional method for selectively forming a shielding layer on a semiconductor device.
Figures 2B, 2C:
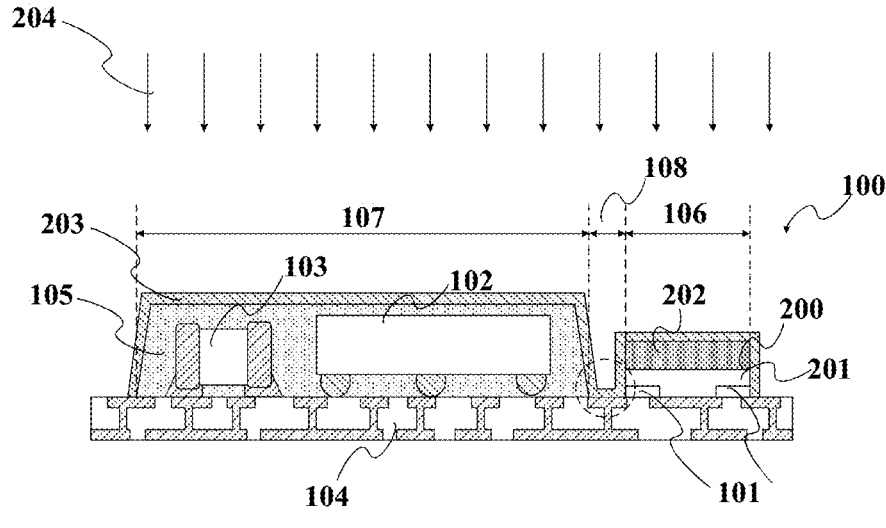

FIG. 2A-2C show a conventional method for selectively forming a shielding layer on the semiconductor device 100 shown in FIG. 1.

As shown in FIG. 2A, a tape 200 is attached onto the substrate 104 of the semiconductor device 100. In particular, the tape 200 covers the first area 106 as well as the conductive pattern 101 on the first area 106. Typically, the tape 200 may include an adhesive layer 201 and a base film 202. When being attached onto the first area 106, the adhesive layer 201 is adhered to the first area 106 and may be used to fill up vacancies or recesses among the conductive pattern 101, thereby forming a flat surface for the base film 202.

As shown in FIG. 2B, after the tape 200 is attached onto the first area 106, a shielding layer 203 is applied to the semiconductor device 100 by, for example, sputtering 204 a conductive material onto the semiconductor device 100. As can be seen from FIG. 2B, a portion of the shielding layer 203 is formed on the tape 200, and the first area 106 on which the tape 200 is attached as well as the conductive pattern 101 on the first area 106 are free of the shielding layer 203 due to the coverage of the tape 200.

As shown in FIG. 2C, after the shielding layer 203 is applied to the semiconductor device 100, the tape 200 can be removed from the semiconductor device 100. By removing the tape 200, the portion of the shielding layer 203 formed on the tape 200 is also removed from the semiconductor device 100. As a result, the shielding layer 203 is a partial shielding layer, which is formed on the surface of the encapsulant 105 that encapsulates the semiconductor die 102 and discrete device 103 to provide EMI shielding for the semiconductor die 102 and discrete device 103, but not formed on the first area 106 as well as the conductive pattern 101 so that the conductive pattern 101 is exposed without EMI shielding.

However, referring back to FIG. 2B, as indicated by the dashed-line circle, the conductive material sputtered onto the semiconductor device 100 may be deposited on the intermediate area 108 between the first area 106 and the second area 107, and may be attached to the side surface of the tape 200. Therefore, a continuous shielding layer 203 is formed on the semiconductor device 100. In such case, when removing the tape 200 from the semiconductor device 100 as shown in FIG. 2C, the continuous shielding layer 203 may break around an edge of the tape 200, so that a metal burr 205 may be generated which extends from an edge of the shielding layer 203 left on the surface of the semiconductor device 100. The metal burr 205 may affect following manufacturing process and the yield of the semiconductor device, and thus is undesirable.

In order to address the aforementioned problem of the conventional selectively shielding method, especially the metal burr problem, an improved selectively shielding method is proposed, as elaborated with reference to the embodiments of the present application as below.

FIG. 3A-3D shows a method for selectively forming a shielding layer on the semiconductor device 100 shown in FIG. 1 according to an embodiment of the present application. It can be readily appreciated that the method can be used for any other similar semiconductor devices that need a partial shielding layer.

Figure 3A:
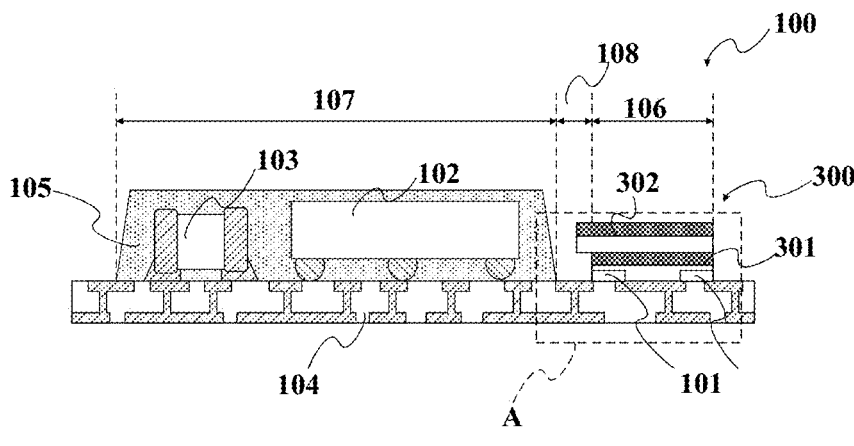
FIG. 3A-3D are schematic diagrams showing a method for selectively forming a shielding layer on a semiconductor device according to an embodiment of the present application.

As shown in FIG. 3A, a tape stack 300 is attached onto the first area 106 of the surface of the semiconductor device 100. Different from the tape 200 shown in FIG. 2, the tape stack 300 includes a lower tape layer 301 that covers the first area 106 and an upper tape layer 302 that is attached on the lower tape layer 301. The upper tap layer 302 further extends beyond the first area 106 and at least partially overhangs above the intermediate area 108.

Figure 3B:
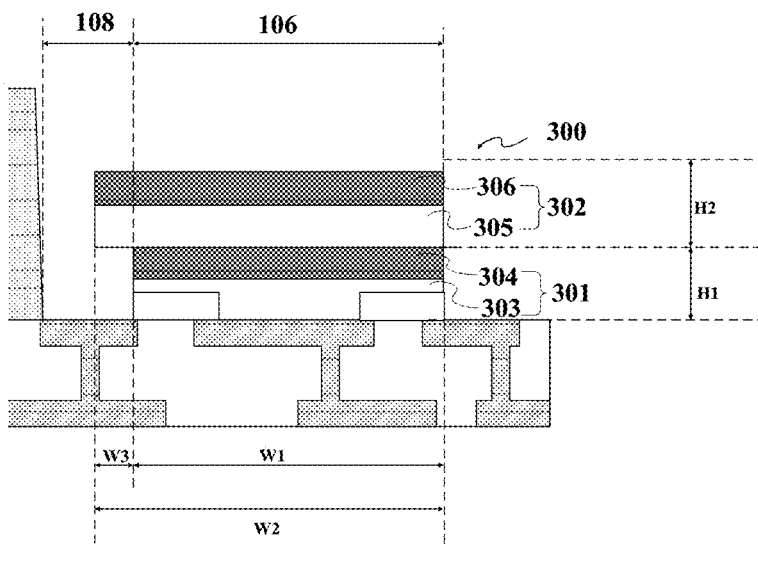

FIG. 3B shows an enlarged view of the tape stack 300 shown in FIG. 3A, as marked by the dashed-line rectangle A. As shown in FIG. 3B, the lower tape layer 301 may include an adhesive layer 303 and a base film 304. When being attached onto the first area 106 of the semiconductor device 100, the adhesive layer 303 is adhered to the first area 106 and may be fill up vacancies or recesses among the conductive pattern 101, thereby forming a flat surface for the base film 304. Similarly, the upper tape layer 302 may also include an adhesive layer 305 and a base film 306. When being attached onto the lower tape layer 301, the adhesive layer 305 is adhered to the lower tape layer 301 and forms a flat surface for the base film 306.

In particular, in the horizontal direction shown in FIG. 3B, which is substantially parallel with the arrangement of the encapsulant 105 and the conductive pattern 101, the lower tape layer 301 has a total width W1, the upper tape layer 302 has a total width W2, and the upper tape layer 302 has a width W3 that extends beyond the first area 106 and overhangs above the intermediate area 108. It should be noted that though the width W2 of the upper tape layer 302 is shown as being greater than the width W1 of the lower tape layer 301, the width W2 of the upper tape layer 302 can also be equal to or less than the width W1 of the lower tape layer 301, as long as the upper tape layer 302 still extends beyond the first area 106 and overhangs above the intermediate area 108. It should be noted that, though in FIG. 3B the upper tape layer 302 is shown as being aligned with the lower tape layer 301 at their edges away from the intermediate area 108, in some other embodiments, the upper tape layer 302 may extend less than or extend beyond the lower tape layer 301 at their edges away from the intermediate area 108.

In some embodiments, the width W1 is from 2 mm to 12 mm, 3 mm to 10 mm, 4 mm to 8 mm or 5 mm to 7 mm. In a preferred embodiment, the width W1 is approximately 6 mm. In some embodiments, the width W2 is from 2 mm to 12 mm, 3 mm to 10 mm, 4 mm to 8 mm or 5 mm to 7 mm. In a preferred embodiment, the width W2 is approximately 6 mm. In some embodiments, the width W3 is from 0.1 mm to 0.3 mm. In a preferred embodiment, the width W3 is approximately 0.15 mm.

In some embodiments, a ratio between the width W3 and the width W1 is 0.02 to 0.05, and a ratio between the width W3 and the width W2 is 0.02 to 0.05.

Further, the lower tape layer 301 has a height H1 and the upper tape layer 302 has a height H2. In some embodiments, the height H1 is from 80 μm to 250 μm, 100 μm to 230 μm, 120 μm to 210 μm, 140 μm to 190 μm or 160 μm to 170 μm. In a preferred embodiment, the height H1 is approximately 165 μm. In some embodiments, the height H2 is from 40 μm to 150 μm, 60 μm to 130 μm, 80 μm to 110 μm or 90 μm to 100 μm. In a preferred embodiment, the height H2 is approximately 95 μm. In some embodiments, a ratio between the height H1 and the height H2 is 1 to 3, or 1.5 to 2.

Accordingly, in some embodiments, a ratio between width W3 of the overhanging portion of the upper tape layer and the height H2 of the lower taper layer is from 0.5 to 5, or preferably from 1 to 3. It can be appreciated that the ratio between the width W3 and the height H2 can be adjusted in practice, depending on the desired distance between the encapsulant and the conductive pattern, the anisotropic characteristics of the shielding deposition process, the stiffness of the upper tape layer, and etc. For example, if the upper tape layer is stiffer, then the width W3 can be set greater to increase the ratio between the width W3 and the height H2. For another example, if the shielding deposition process is sufficiently anisotropic, then the width W3 can be set smaller to decrease the ratio between the width W3 and the height H2 as well as reduced the distance between the encapsulant and the conductive pattern.

As can be seen from FIG. 3B, the overhanging portion of the upper tape layer 302 creates a cavity between the surface of the substrate and the overhanging portion, with an opening facing towards the encapsulant. In particular, a width of the opening is equal to the height H1 of the lower tape layer 301 and a depth of the opening is equal to the width W3 of the overhanging portion of the upper tape layer 302. It should be noted that although two layers of tapes are illustrated in FIG. 3B, more layers of tapes can be included in the tape stack. The additional layers can either increase the width of the opening of the cavity if they are closes to the lower tape layer 301 (the additional layers can support the overhanging portion farther away from the substrate), or can increase the depth of the opening if they are closer to the upper tape layer 302 (the additional layers can increase the stiffness of the overhanging portion).

Figures 3C, 3D:
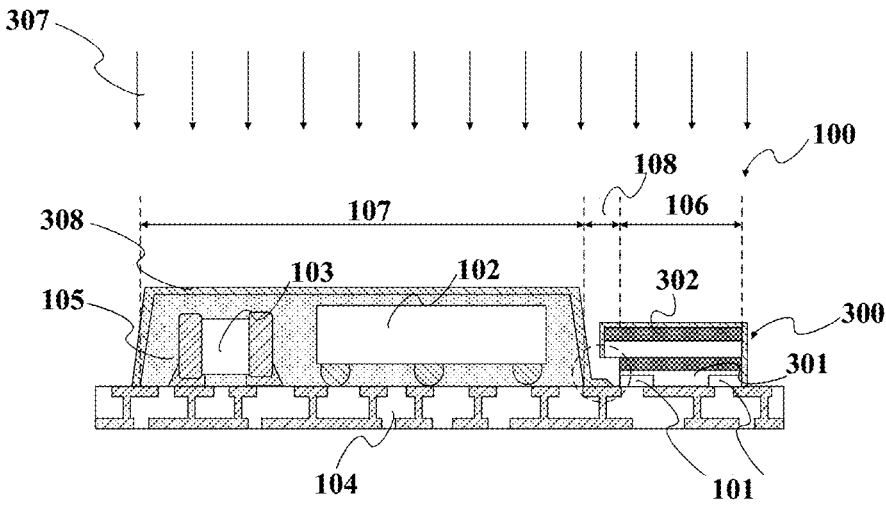

As shown in FIG. 3C, a sputtering process or other similar deposition process is performed. Due to the overhanging portion of the upper tape layer 302 above the intermediate area 108, when sputtering 307 a conductive material onto the semiconductor device 100, the amount of conductive material deposited on the intermediate area 108 is significantly less than within a cavity on the intermediate area 108 of the substrate shown in FIG. 2B, as indicated by the dashed-line circle. Therefore, the shielding layer 308 formed on the semiconductor device 100 is not a continues layer but breaks at the intermediate area 108 due to the overhanging portion of the upper tape layer 302. It can be readily appreciated that the shape and size of the cavity formed under the overhanging portion can be adjusted, depending on the desired distance between the encapsulant and the conductive pattern, the anisotropic characteristics of the shielding deposition process, the stiffness of the upper tape layer, and etc. In some embodiments, the cavity is configured that the shielding layer 308 formed on the encapsulant 105 may extend into the cavity but cannot reach the conductive pattern 101.

As shown in FIG. 3D, after the shielding layer 308 is formed on the semiconductor device 100, the tape stack 300 can be removed from the semiconductor device 100. By removing the tape stack 300, the portion of the shielding layer 308 formed on the tape stack 300 is also removed from the semiconductor device 100. As a result, the shielding layer 308 is formed on the surface of the encapsulant 105 that encapsulates the semiconductor die 102 and discrete device 103 to provide EMI shielding for them, while no shielding layer is formed on the first area 106 as well as the conductive pattern 101 so that the conductive pattern 101 is exposed. Besides, since the portion of the shielding layer 308 disposed on the tape stack 300 is not connected with the other portion of the shielding layer 308 due to the overhanging portion of the upper tape layer 302, removing the tape stack 300 as well as the portion of the shielding layer 308 formed on the tape stack 300 may not cause the shielding layer 308 to unevenly break and therefore no metal burr is formed.

FIG. 4 is a flowchart illustrating a method 400 for selectively forming a shielding layer on a semiconductor device according to an embodiment of the present application.

As shown in FIG. 4, the method 400 starts with step 402 of attaching a tape stack onto a predetermined area of a substrate of the semiconductor device, wherein the tape stack includes a lower tape layer that covers the predetermined area and an upper tape layer that extends beyond the predetermined area and overhangs above an intermediate area adjacent to the predetermined area. For example, as shown in FIG. 3A, the tape stack 300 can be attached onto a first area 106 (i.e., the predetermined area). The lower tape layer 301 of the tape stack 300 covers the first area 106, and the upper tape layer 302 of the tape stack 300 extends beyond the first area 106 and overhangs above the intermediate area 108 adjacent to the first area 106.

Afterwards, in step 404, a shielding layer is applied to the substrate of the semiconductor device. For example, as shown in FIG. 3C, after the tape stack 300 is attached to the first area 106 of the semiconductor device 100, a shielding layer 308 is applied to the semiconductor device 100. In some embodiments, the shielding layer is applied to the semiconductor device by sputtering a conductive material to the semiconductor device.

In step 406, the tape stack and a portion of the shielding layer formed on the tape stack is removed from the substrate of the semiconductor device. For example, as shown in FIG. 3D, after the shielding layer 308 is formed on the semiconductor device 100, the tape stack 300 as well as a portion of the shielding layer 308 formed on the tape stack 300 is removed from the semiconductor device 100. As a result, the shielding layer 308 covers the second area 107 for providing EMI shielding for the semiconductor die 102 and discrete device 103, while the first area 106 and the conductive pattern 101 are exposed without EMI shielding. Due to the overhang upper tape layer 302, the portion of the shielding layer 308 formed on the tape stack 300 is not connected with the other portion of the shielding layer 308, therefore removing the tape stack 300 as well as the portion of the shielding layer 308 formed on the tape stack 300 from the semiconductor device 100 may not cause the shielding layer 308 to unevenly break and therefore no metal burr is formed.

FIG. 5 is a flowchart illustrating a method 500 for selectively forming a shielding layer on a semiconductor device according to another embodiment of the present application.

As shown in FIG. 5, the method 500 starts with step 502 of attaching a lower tape layer onto a predetermined area of a substrate of the semiconductor device, and step 504 of attaching an upper tape layer onto the lower tape layer to form a tape stack, wherein the upper tape layer extends beyond the predetermined area and overhangs above an intermediate area adjacent to the predetermined area. In other words, the lower tape layer and the upper tape layer can be separately attached to the substrate of the semiconductor device. For example, as shown in FIG. 3A, the lower tape layer 301 can be first attached onto the first area 106 (i.e., the predetermined area), and the upper tape layer 302 is then attached onto the lower tape layer 301 to form the tape stack 300. The upper tape layer 302 of the tape stack 300 extends beyond the first area 106 and overhangs above the intermediate area 108 adjacent to the first area 106.

In some embodiments, the lower tape layer and the upper tape layer can also be attached together to form a tape stack before being attached to the substrate of the semiconductor device, and the entire tape stack is then attached onto the predetermined area of the substrate of the semiconductor device. That is, the tape stack can be formed in advance by attaching the lower tape layer and the upper tape layer together, and then the formed tape stack can be integrally attached to the semiconductor device.

Afterwards, in step 506, a shielding layer is applied to the substrate of the semiconductor device. Step 506 is similar as step 404 illustrated in FIG. 4 and will not be repeated herein.

In step 508, the tape stack and a portion of the shielding layer formed on the tape stack is removed from the substrate of the semiconductor device. Step 508 is similar as step 406 illustrated in FIG. 4 and will not be repeated herein.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for selectively forming a shielding layer on a semiconductor device, the method comprising:
   attaching a tape stack onto a predetermined area of a substrate of the semiconductor device, wherein the tape stack comprises a lower tape layer that covers the predetermined area and an upper tape layer that extends beyond the predetermined area and overhangs above an intermediate area adjacent to the predetermined area;
   applying a shielding layer to the substrate of the semiconductor device; and
   removing the tape stack and a portion of the shielding layer formed on the tape stack from the substrate of the semiconductor device.

2. The method of claim 1, wherein each of the lower tape layer and the upper tape layer comprises a base film and an adhesive layer.

3. The method of claim 1, wherein attaching a tape stack onto a predetermined area of a substrate of the semiconductor device comprises:
   attaching the lower tape layer onto the predetermined area of the substrate of the semiconductor device; and
   attaching the upper tape layer onto the lower tape layer.

4. The method of claim 1, wherein attaching a tape stack onto a predetermined area of a substrate of the semiconductor device comprises:
   attaching the lower tape layer and the upper tape layer together to form the tape stack; and
   attaching the formed tape stack onto the predetermined area of the substrate of the semiconductor device.

5. The method of claim 1, wherein an conductive pattern is disposed on the predetermined area of the semiconductor device, and the tape stack covers the conductive pattern.

6. The method of claim 5, wherein one or more electronic components encapsulated by an encapsulant are disposed on a shielding area of the substrate of the semiconductor device, the shielding area being spaced from the predetermined area by the intermediate area, and wherein the shielding layer is applied to a surface of the encapsulant.

7. The method of claim 1, wherein a ratio between a width of the upper tape layer overhanging above the intermediate area and a width of the lower tape layer is 0.02 to 0.05.

8. The method of claim 1, a ratio between a width of the upper tape layer overhanging above the intermediate area and a total width of the upper tape layer is 0.02 to 0.05.

9. The method of claim 1, wherein a ratio between a height of the lower tape layer and a height of the upper tape layer is 1 to 3.

10. The method of claim 1, wherein a ratio between a width of the upper tape layer overhanging above the intermediate area and a height of the lower taper layer is from 0.5 to 5.

11. The method of claim 10, wherein the conductive material comprises at least one of the following: Al, Cu, Sn, Ni, Au, Ag or any combination thereof.

12. The method of claim 1, wherein applying a shielding layer to the substrate of the semiconductor device comprises sputtering a conductive material to the substrate of the semiconductor device.

* * * * *